United States Patent [19]

Miyakawa

[11] Patent Number: 5,328,861
[45] Date of Patent: Jul. 12, 1994

[54] METHOD FOR FORMING THIN FILM TRANSISTOR

[75] Inventor: Tatsuya Miyakawa, Fussa, Japan

[73] Assignee: Casio Computer Co., Ltd., Tokyo, Japan

[21] Appl. No.: 968,382

[22] Filed: Oct. 29, 1992

[30] Foreign Application Priority Data

Nov. 25, 1991 [JP] Japan .................................. 3-334596

[51] Int. Cl.[5] ........................................ H01L 21/265
[52] U.S. Cl. .................................... 437/40; 437/247; 437/241; 437/978; 148/DIG. 90; 148/DIG. 150
[58] Field of Search .................... 437/40, 41, 978, 84, 437/913, 920; 148/DIG. 150, DIG. 118

[56] References Cited

U.S. PATENT DOCUMENTS

| | | | |
|---|---|---|---|
| 4,232,327 | 11/1980 | Hsu | 437/913 |
| 4,264,376 | 4/1981 | Yatsuda et al. | 437/42 |
| 4,266,985 | 5/1981 | Ito et al. | 437/42 |
| 4,885,616 | 12/1989 | Ohta . | |
| 4,951,113 | 8/1990 | Huang et al. . | |

FOREIGN PATENT DOCUMENTS

| | | | |
|---|---|---|---|
| 55-22878 | 2/1980 | Japan | 437/920 |
| 61-150385 | 7/1986 | Japan . | |
| 01209764 | 8/1989 | Japan . | |
| 0265274 | 3/1990 | Japan . | |
| 0418524 | 1/1992 | Japan . | |
| 0485969 | 3/1992 | Japan . | |

OTHER PUBLICATIONS

Wolf, "Silicon Processing for the VLSI Era" vol. 2, 1986, pp. 20–22.

Sera et al; "High Performance TFT's Fabricated by XeCl Excimer Laser Annealing of Hydrogenated Amorphous Silicon Film"; IEEE 1989, Electron Device, pp. 2888–2871.

Primary Examiner—Brian E. Hearn
Assistant Examiner—Michael Trinh
Attorney, Agent, or Firm—Frishauf, Holtz, Goodman & Woodward

[57] ABSTRACT

An amorphous semiconductor layer is deposited on an insulating substrate, and an excimer laser is radiated thereon, and thus the amorphous is crystallized. A silicon oxide layer is deposited on the semiconductor layer, and a silicon nitride layer is deposited on the silicon oxide layer to be thicker than the silicon oxide layer. Thereafter, a gate electrode is formed on the silicon nitride layer. Thus, there is provided a method for a thin film transistor having a good mobility of carriers and a good characteristic of a breakdown voltage in that a gate insulating film is formed of a double-layer structure having the silicon oxide and silicon nitride layers.

9 Claims, 3 Drawing Sheets

METHOD FOR FORMING THIN FILM TRANSISTOR

BACKGROUND OF THE INVENTION

1. Field of the Invention

The present invention relates to a method for forming a thin film transistor and, more particularly to a method for forming a thin film transistor, which can obtain good characteristics at a low temperature.

2. Description of the Related Art

A thin film transistor is used in a device having an large area and a transmittancy, which cannot be formed on a monocrystalline wafer, such as a liquid crystal display. In such a device, glass material having the transmittancy and the low cost is used as a base material. Since a melting point of glass material is low, glass material cannot be applied to the conventional method for forming the transistor on the monocrystalline wafer. For example, in the case where the conventional monocrystalline wafer is used, a gate insulating film is generally formed by thermally oxidizing a silicon wafer. However, in this thermal oxidation method, since a high temperature treatment such as 1000° to 1300° C. is performed, this thermal oxidation method cannot be applied to the case that base material is glass having a low melting point.

In other words, all processes for forming the thin film transistor must be performed at a low temperature as compared with the method for forming the transistor on the monocrystalline wafer. In addition, peculiar characteristics of amorphous or polycrystalline semiconductors, which are different from the characteristics of a monocrystalline semiconductor, must be added to the thin film transistor. Therefore, if the conventional manufacturing method is directly used in forming the thin film transistor, the characteristics are largely lowered. Particularly, the method for forming the gate insulating film is an important point. As a method for forming the gate insulating film at a low temperature, there is known the method in which silicon oxide or silicon nitride is deposited by CVD (Chemical Vapor Deposition). A silicon nitride gate insulating film can obtain a good breakdown voltage. However, a characteristic of a surface boundary between the silicon nitride gate insulating film and a thin film semiconductor layer is deteriorated. Particularly, the mobility of the positive hole is low, and the value of the mobility of the hole is lower than that of an electron by one digit. On the other hand, a characteristic of a surface boundary between the silicon oxide gate insulating film and the thin film semiconductor layer is relatively good. However, there is a disadvantage in that the breakdown voltage of the silicon oxide film is inferior to that of the silicon nitride film.

SUMMARY OF THE INVENTION

An object of the present invention is to provide a method for forming a thin film transistor which can obtain good characteristics of mobility and breakdown voltage.

The method for forming a thin film transistor of the present invention comprises the steps of forming a semiconductor layer having a source region, a drain region, and a channel region on an insulating substrate, directly depositing a silicon oxide layer on the channel region of the semiconductor layer, depositing a silicon nitride layer on the silicon oxide layer to be thicker than the silicon oxide layer, and forming a gate electrode on the silicon nitride layer and forming a source electrode and a drain electrode on the source region and the drain region of the semiconductor layer, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
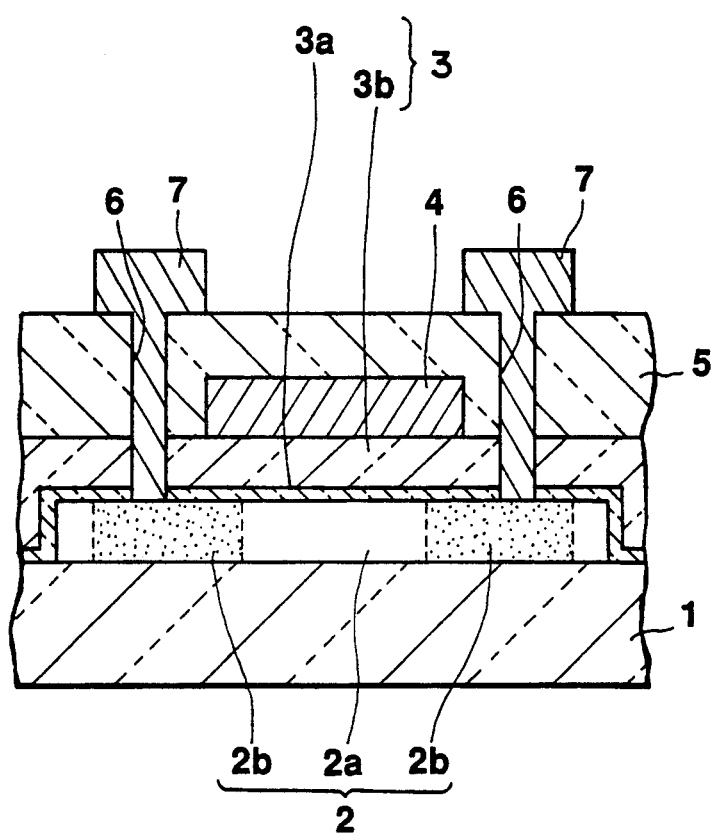
FIG. 1 is an enlarged cross sectional view showing a field effect type thin film transistor formed by a method for forming a thin film transistor of the present invention.

FIG. 1 shows an embodiment of a non-memory type field effect thin film transistor formed by a method for forming a thin film transistor of the present invention.

The non-memory type field effect thin film transistor is formed on an insulating substrate 1 formed of glass or the like. The thin film transistor comprises a semiconductor layer 2, a gate insulating layer 3, a gate electrode 4, a passivating insulating film 5, and source and drain electrodes 7.

The semiconductor layer 2 is island-formed of polysilicon, and has a channel region 2a at a substantially central portion, and source and drain regions 2b, in which dopant such as phosphorus and boron is diffused, on both sides of the channel region 2a.

The gate insulating layer 3 comprises a silicon oxide layer ($SiO_2$) 3a which is deposited on the semiconductor layer 2, and a silicon nitride layer ($Si_3N_4$) 3b which is deposited on the silicon oxide layer 3a. The silicon oxide layer 3a is formed to have a uniform thickness of 100 to 400 Å over the whole region, preferably 250 Å, and a good surface boundary between the silicon oxide layer 3a and the semiconductor layer 2 is formed. The silicon nitride layer 3b is formed to have a uniform thickness of 1000 to 2000 Å, preferably 1600 Å over the whole region, so that the breakdown characteristic of the gate insulating film 3 is enhanced. The silicon nitride layer 3b is formed of $Si_3N_4$ whose atomic composition ratio Si/N is the stoichiometric ratio of 0.75. In this case, the important point is that the silicon nitride film 3b is thicker than the silicon oxide film 3a. Thereby, mobility of carriers of the semiconductor layer 2 can be increased and a sufficient breakdown characteristic can be reserved.

The gate electrode 4 and the source and drain electrodes 7 are formed of conductive material such as aluminum. The source and drain electrodes 7 are respectively electrically connected to the source and drain regions 2b through through holes 6 which are formed in the passivating film 5, the silicon nitride layer 3b and the silicon oxide layer 3a.

Figure 2:
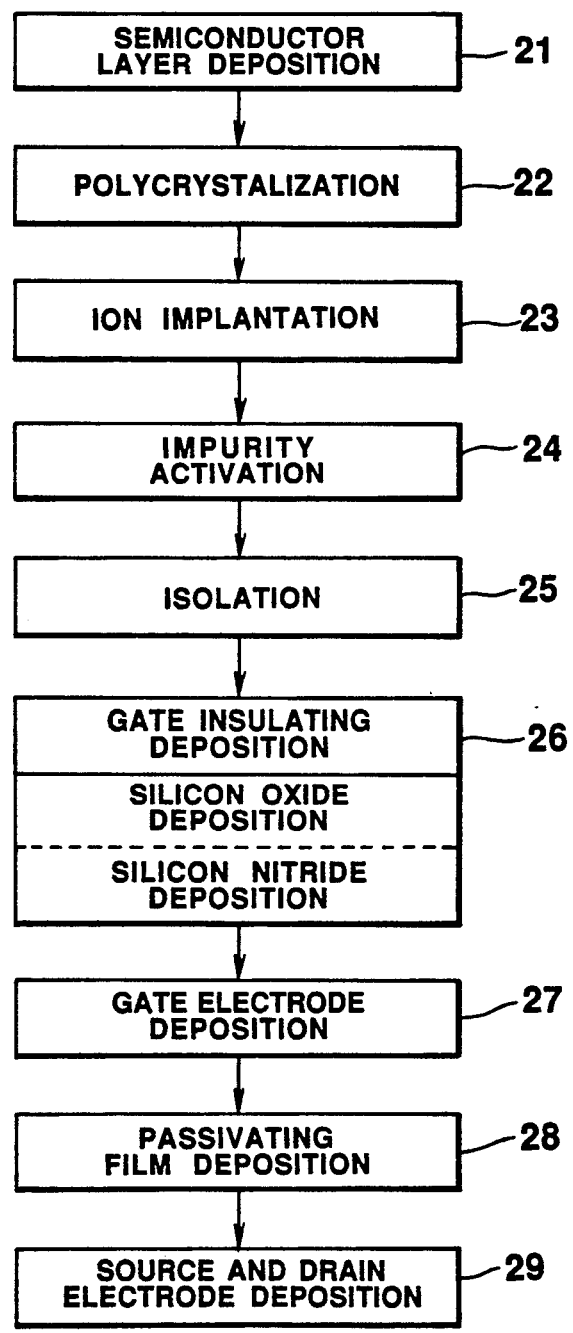
FIG. 2 is a flow chart showing the processes of the method for forming the thin film transistor of the present invention.

The method for forming the field effect type thin film transistor will be explained with reference to the forming processes shown in FIG. 2.

In a semiconductor layer deposition process 21, an amorphous silicon film having a thickness of about 500 Å is deposited on the entire upper surface of the insulating substrate 1 by plasma CVD so as to form the semiconductor layer 2. In a polycrystalization process 22, the amorphous silicon film is crystallized by irradiating an XeCl excimer laser on the amorphous silicon film, so that a polysilicon film is formed. In an ion implantation process 23, photoresist is used as a mask, and dopants are implanted into the polysilicon film where the source and drain regions 2b are to be formed by an ion implantation device. Thereafter, the photoresist as an ion-implanted mask is etched and thus removed. In an impurity activation process 24, an XeCl excimer laser is irradiated on the ion-implanted portions, so that the ion-implanted impurities are activated. In an isolation process 25, an unnecessary part of the polysilicon film is etched by using a conventional photolithographic technique, so that and the semiconductor layer 2 is island-formed on the upper surface of the insulating substrate 1. As already explained, under this state, since dopant is implanted in the ion-implantation process 23, the central portion of the semiconductor layer 2 in which no dopant is implanted is used as a channel region 2a, and both side portions are used as source and drain regions 2b in which dopants are diffused.

In a gate insulating film depesition process 26, the silicon oxide (SiO$_2$) layer 3a having a thickness of about 100 to 400 Å, preferably 250 Å is deposited on the entire surfaces of the semiconductor layer 2 and the insulating substrate 1 by sputtering. In this case, an inactive gas ion is made to collide with a target which is formed of SiO$_2$, and SiO$_2$, which comes out of the target, is deposited on the semiconductor layer 2 which is formed of polysilicon. Then, the silicon nitride (Si$_3$N$_4$) layer 3b is deposited on the upper surface of SiO$_2$ layer 3a by plasma CVD to have a thickness of about 1000 to 2000 Å, preferably about 1600 Å. In a gate electrode deposition process 27, the gate electrode 4, which is formed of aluminum or chrome, is deposited and patterned to have a thickness of about 1000 Å on the upper surface of that portion of Si$_3$N$_4$ layer 3b, which corresponds to the channel region 2a by sputtering and etching. In a passivating film deposition process 28, the passivating film 5 which is formed of silicon nitride, is deposited to have a thickness of 3000 Å on the entire surfaces of the gate electrode 4 and the gate insulating film 3 by plasma CVC. In source and drain electrodes deposition process, the through holes 6 are formed through the parts of the passivating film 5 and the gate insulating film 3, which correspond to the source and drain regions 2b. Thereafter, the source and drain electrodes 7, which are formed of aluminum, are deposited and patterned to have a thickness of 5000 Å in the through holes 6 and on predetermined portions of the upper surface of the passivating film 5 by sputtering and etching. In this manner, the field electric type thin film transistor shown in FIG. 1 is manufactured.

According to the above-explained field electric type thin film transistor, the gate insulating film 3 has a double-layer structure formed of silicon oxide layer 3a having a good surface boundary between the gate layer 3a and silicon nitride layer 3b, the silicon oxide insulating layer (SiO$_2$ layer) 3a and the semiconductor layer 2 is formed on the semiconductor layer 2, and silicon nitride layer 3b having a high breakdown voltage is formed on the silicon oxide layer 3a to be thicker than the silicon oxide layer 3a. Therefore, there can be formed a good surface boundary between the gate insulating film 3 and the semiconductor layer 2, and the breakdown characteristic of the insulating film 3 can be enhanced.

Figure 3:
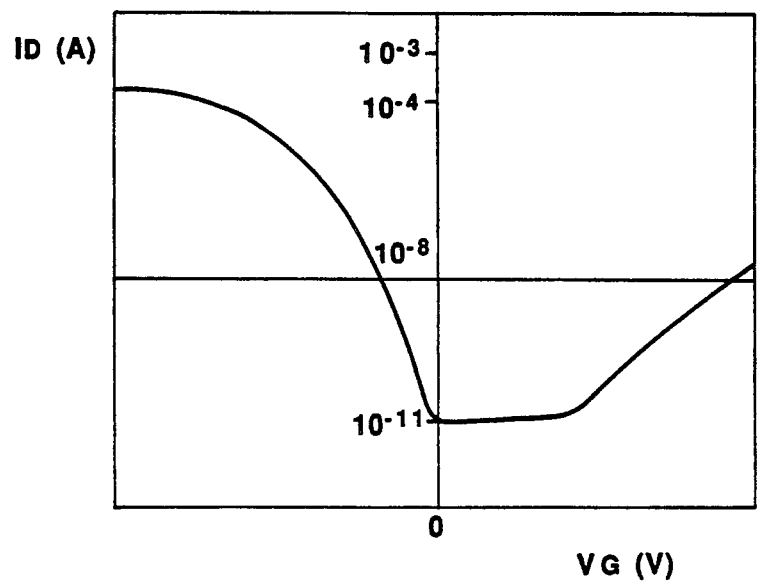
FIG. 3 is a $V_G$-$I_D$ characteristic view of a P-MOS FETTFT formed by the method for forming the thin film transistor of the present invention.

FIG. 3 is a $V_G$–$I_D$ characteristic view in the case that a P-MOS field electric type thin film transistor of FIG. 1 is formed in a state that boron is used as dopant, which is diffused in the source and drain regions 2b.

Figure 4:
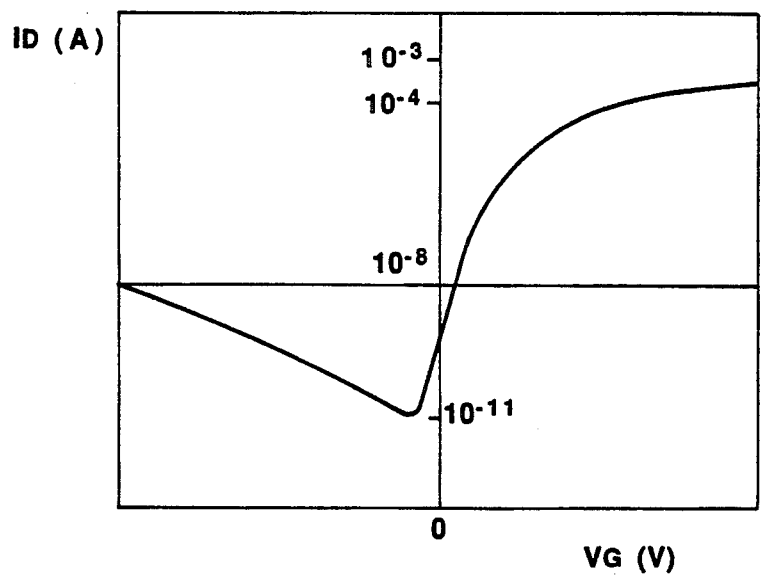
FIG. 4 is a $V_G$-$I_D$ characteristic view of an N-MOS FETTFT formed by the method for forming the thin film transistor of the present invention.

FIG. 4 is a $V_G$–$I_D$ characteristic view in the case that an N-MOS field electric type thin film transistor of FIG. 1 is formed in a state that phosphorous is used as dopant, which is diffused in the source and drain regions 2b. As is understood from both figures, in both thin film transistors, an $I_{ON}/I_{OFF}$ ratio having seven or more digits can be obtained and sufficient mobility can be also obtained. In this case, though data is not shown, when the silicon oxide layer 3a was formed by not sputtering but plasma CVD, such characteristics was not obtained. In addition, it was confirmed that the transistor characteristics such as a threshold voltage and the like were deteriorated, and the silicon oxide layer 3a was preferably deposited by sputtering.

Moreover, the breakdown voltage was measured when the thickness of the silicon oxide layer 3a and that of the silicon nitride layer were set to 250 Å and 1600 Å, respectively. As a result, no problem was generated even if the voltage of 100 V was applied thereto (wherein about 50 V corresponds to 1 MV/cm). In order to compared with the present invention, several tens of thin film transistors having the gate insulating film, which was formed on only the silicon oxide layer having a thickness of 952 Å, that is the same electrostatic capacity as that of the gate insulating film 3 of the present invention were formed. As a result, defects were generated in these transistors by the applied voltage of 30 to 90 V.

According to the above points, it was confirmed that the method for forming the thin film transistor of the present invention was excellent in the characteristics such as the mobility of carriers, the breakdown voltage, and the like.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a thin film transistor comprising the steps of:
   forming a polysilicon semiconductor layer having a source region, a drain region, and a channel region, on an insulating substrate;

directly depositing a two-layer gate insulating film on said polysilicon semiconductor layer, said two-layer gate insulating film having:
   a silicon oxide layer formed on said channel region of said polysilicon semiconductor layer by a sputtering process; and
   a silicon nitride layer formed on said silicon oxide layer by a plasma CVD process, said silicon nitride layer having a thickness that is greater than a thickness of said silicon oxide layer; and then
forming a gate electrode on said silicon nitride layer; and
forming a source electrode and a drain electrode on said source region and said drain region of said polysilicon semiconductor layer, respectively.

2. The method according to claim 1, wherein the thickness of said silicon oxide layer is 100 to 400 Å.

3. The method according to claim 1, wherein the thickness of said silicon nitride layer is 1000 to 2000 Å.

4. The method according to claim 1, wherein said polysilicon semiconductor layer forming step includes a step of depositing an amorphous silicon, and a step of crystallizing said armorphous silicon to form said polysilicon semiconductor layer.

5. The method according to claim 4, wherein said amorphous silicon crystallizing step includes an excimer laser radiation step to form said polysilicon semiconductor layer.

6. The method according to claim 1, wherein said polysilicon semiconductor layer forming step includes a step of implanting dopants in said source region and said drain region, and a step of activating said dopants.

7. The method according to claim 6, wherein said dopant activation step includes a step of radiating an excimer laser on said dopant.

8. The method according to claim 4, wherein the thickness of said silicon oxide layer is 100 to 400 Å.

9. The method according to claim 4, wherein the thickness of said silicon nitride layer is 1000 to 2000 Å.

* * * * *